United States Patent
Oka

(10) Patent No.: US 8,633,519 B2
(45) Date of Patent: Jan. 21, 2014

(54) GROUP III NITRIDE SEMICONDUCTOR DEVICE, PRODUCTION METHOD THEREFOR, POWER CONVERTER

(75) Inventor: Toru Oka, Kiyosu (JP)

(73) Assignee: Toyoda Gosei Co., Ltd., Kiyosu-Shi, Aichi-Ken (JP)

( * ) Notice: Subject to any disclaimer, the term of this patent is extended or adjusted under 35 U.S.C. 154(b) by 521 days.

(21) Appl. No.: 12/923,405

(22) Filed: Sep. 20, 2010

(65) Prior Publication Data

US 2011/0068371 A1 Mar. 24, 2011

(30) Foreign Application Priority Data

Sep. 24, 2009 (JP) .................................. 2009-219254

(51) Int. Cl.
*H01L 29/66* (2006.01)

(52) U.S. Cl.
USPC .................................... 257/201; 257/E29.246

(58) Field of Classification Search
None
See application file for complete search history.

(56) References Cited

U.S. PATENT DOCUMENTS

| 4,084,175 A * | 4/1978 | Ouyang ........................ 257/336 |
| 2006/0131668 A1 * | 6/2006 | Wagoner ........................ 257/401 |
| 2008/0142845 A1 | 6/2008 | Kodama et al. |
| 2010/0301358 A1 * | 12/2010 | Shibata et al. ................... 257/98 |

FOREIGN PATENT DOCUMENTS

| CN | 101465372 A | | 6/2009 |
| CN | 101465372 A | * | 6/2009 |
| JP | 2008-147593 A | | 6/2008 |
| JP | 2009-99691 A | | 5/2009 |

OTHER PUBLICATIONS

Chinese Office Action dated Jun. 14, 2012, with English translation.

* cited by examiner

*Primary Examiner* — Michael Lebentritt
*Assistant Examiner* — Kevin Quinto
(74) *Attorney, Agent, or Firm* — McGinn IP Law Group, PLLC

(57) ABSTRACT

Provided is an HEMT exhibiting a normally-off characteristic and low on-state resistance, which includes a first carrier transport layer; two separate second carrier transport layers formed of undoped GaN and provided on two separate regions of the first carrier transport layer; and carrier supply layers formed of AlGaN and respectively provided on the two separate second carrier transport layers. The second carrier transport layers and the carrier supply layers are respectively formed through crystal growth on the first carrier transport layer. The heterojunction interface between the second carrier transport layer and the carrier supply layer exhibits high flatness, and virtually no growth-associated impurities are incorporated in the vicinity of the heterojunction interface. Therefore, reduction in mobility of 2DEG is prevented, and on-state resistance is reduced.

15 Claims, 7 Drawing Sheets

GROUP III NITRIDE SEMICONDUCTOR DEVICE, PRODUCTION METHOD THEREFOR, POWER CONVERTER

BACKGROUND OF THE INVENTION

1. Field of the Invention

The present invention relates to a Group III nitride semiconductor device, and to a method for producing the device. More particularly, the present invention relates to a semiconductor device with reduced on-state resistance (e.g., an HEMT (high electron mobility transistor), also called an HFET (heterostructure field effect transistor), the term of HEMT is used in the present specification, or a diode), and to a method for producing the device. The present invention also relates to a power converter including such a Group III nitride semiconductor device.

2. Background Art

Group III nitride semiconductors have been widely used as a material for light-emitting devices. Also, Group III nitride semiconductors are envisaged as a material for power devices, since they exhibit high electron mobility and have a breakdown field strength about 10 times that of Si. Hitherto developed power devices include an HEMT (high electron mobility transistor) in which a two-dimensional electron gas (2DEG) layer formed at a heterojunction interface serves a channel. When a GaN HEMT is produced so as to have the same structure as a conventional HEMT (e.g., GaAs HEMT), the GaN HEMT exhibits a normally-on characteristic; i.e., the HEMT is in an ON state under application of no voltage to a gate electrode. However, an HEMT exhibiting a normally-on characteristic poses a safety problem. Therefore, there have been proposed various HEMT structures which realize a normally-off characteristic (i.e., no current flows between a source electrode and a drain electrode under application of no voltage to a gate electrode).

For example, Japanese Patent Application Laid-Open (kokai) No. 2008-147593 discloses an HEMT which realizes a normally-off characteristic; specifically, an HEMT having an MIS structure in which a carrier supply layer is not formed directly below a gate electrode. This structure realizes a normally-off characteristic, since a 2DEG layer is not formed in a region directly below the gate electrode. In order to achieve this structure, Japanese Patent Application Laid-Open (kokai) No. 2008-147593 discloses a method for exposing a surface of a carrier transport layer by removing a portion of a carrier supply layer through dry etching.

Japanese Patent Application Laid-Open (kokai) No. 2009-99691 discloses a method for producing an HEMT, in which a first carrier supply layer is formed on a carrier transport layer; a mask is formed on a specific region of the first carrier supply layer; two second carrier supply layers are formed, through selective re-growth, on unmasked regions of the first carrier supply layer so that the second carrier supply layers are separated from each other; a source electrode is formed on one of the second carrier supply layers; a drain electrode is formed on the other second carrier supply layer; and a gate electrode is formed on the mask.

However, when the structure disclosed in Japanese Patent Application Laid-Open (kokai) No. 2008-147593 is produced through the method using selective re-growth disclosed in Japanese Patent Application Laid-Open (kokai) No. 2009-99691, problems arise in that, for example, impurities, etc. are incorporated at the interface between a carrier transport layer and a carrier supply layer when the carrier supply layer is grown on the carrier transport layer, and flatness of the interface between these layers is degraded, which results in reduction in mobility of 2DEG generated at the heterojunction interface between the carrier transport layer and the carrier supply layer, and an increase in on-state resistance.

SUMMARY OF THE INVENTION

In view of the foregoing, an object of the present invention is to provide a Group III nitride semiconductor device with reduced on-state resistance. Another object of the present invention is to provide a method for producing the semiconductor device. Yet another object of the present invention is to provide a power converter comprising the semiconductor device.

In a first aspect of the present invention, there is provided a semiconductor device comprising:

a first carrier transport layer formed of a Group III nitride semiconductor;

a second carrier transport layer which is formed through selective re-growth of a Group III nitride semiconductor and is provided on a region of the first carrier transport layer; and a carrier supply layer formed through selective growth of a Group III nitride semiconductor having a bandgap energy (hereinafter may be referred to simply as "bandgap") larger than that of the Group III nitride semiconductor of the second carrier transport layer, the carrier supply layer being provided on the second carrier transport layer.

As used herein, "Group III nitride semiconductor" encompasses a semiconductor represented by the formula $Al_xGa_yIn_zN$ ($x+y+z=1$, $0 \leq x, y, z \leq 1$); such a semiconductor in which a portion of Al, Ga, or In is substituted by another Group 13 element (Group 3B element) (i.e., B or Tl), or a portion of N is substituted by another Group 15 element (Group 5B element) (i.e., P, As, Sb, or Bi). Specific examples of the Group III nitride semiconductor include those containing at least Ga, such as GaN, InGaN, AlGaN, and AlGaInN. Generally, Si is employed as an n-type impurity, and Mg is employed as a p-type impurity.

Each of the first carrier transport layer, the second carrier transport layer, and the carrier supply layer may be formed of a single layer or a plurality of layers. Generally, the first carrier transport layer and the second carrier transport layer are formed of the same Group III nitride semiconductor (e.g., GaN). However, these layers are not necessarily formed of the same Group III nitride semiconductor.

Preferably, the second carrier transport layer is formed of undoped GaN for the purpose of preventing reduction in mobility of 2DEG. When the second carrier transport layer is formed of a plurality of layers, preferably, at least a layer (among the layers) which is in contact with the carrier supply layer is formed of undoped GaN.

The carrier supply layer may be formed of any Group III nitride semiconductor having a bandgap larger than that of the Group III nitride semiconductor of the second carrier transport layer. The carrier supply layer may be an undoped layer, or may be doped with an n-type impurity. The carrier supply layer may have a cap layer thereon.

A single layer or a plurality of layers formed of a Group III nitride semiconductor may be further provided on the second carrier transport layer. For example, there may be provided, on the carrier supply layer, one or more layer pairs, each pair including an under layer formed through selective growth of a Group III nitride semiconductor, and an upper layer formed through selective growth of a Group III nitride semiconductor having a bandgap larger than that of the Group III nitride semiconductor of the under layer and wherein an under layer which contacts with the carrier supply layer has a bandgap larger than that of the Group III nitride semiconductor of the carrier supply layer. When a plurality of layer pairs are provided on the carrier supply layer, the smaller-bandgap layers of the layer pairs may be formed of different Group III nitride semiconductors, and the larger-bandgap layers of the layer pairs may be formed of different Group III nitride semiconductors.

The present invention is applicable to a semiconductor device in which a 2DEG layer is formed in the vicinity of the heterojunction interface between the second carrier transport layer and the carrier supply layer and on the side of the second carrier transport layer, and the 2DEG layer serves as a channel. For example, the present invention is applicable to an HEMT, an HBT (heterojunction bipolar transistor), and a diode.

A second aspect of the present invention is drawn to a specific embodiment of the semiconductor device according to the first aspect, wherein laminate structures comprising a second carrier transport layer and a carrier supply layer are formed on two separate regions of a surface of the first carrier transport layer, and wherein the semiconductor device further comprises a first electrode which is provided on the carrier supply layer of one of the two separate regions and which is electrically connected to the second carrier transport layer of the same region; a second electrode which is provided on the carrier supply layer of the other region and which is electrically connected to the second carrier transport layer of the same region; an insulating film which is provided on a region of the first carrier transport layer sandwiched between the two separate regions and also on the mutually facing lateral end surfaces of the two separate laminate structures; and a control electrode formed on the insulating film.

The first electrode or the second electrode may be provided directly on the corresponding carrier supply layer, or may be provided, via a Group III nitride semiconductor layer (e.g., a cap layer), on the carrier supply layer.

A third aspect of the present invention is drawn to a specific embodiment of the semiconductor device according to the second aspect, wherein the insulating film is provided also on the top surfaces of the carrier supply layers, and the control electrode extends, via the insulating film, onto the carrier supply layers.

A fourth aspect of the present invention is drawn to a specific embodiment of the semiconductor device according to the second or third aspect, wherein a portion or the entirety of the insulating film is formed of a plurality of layers.

A fifth aspect of the present invention is drawn to a specific embodiment of the semiconductor device according to any of the second to fourth aspects, wherein a portion of the insulating film provided on the first carrier transport layer exhibits a property different from that of a portion of the insulating film provided on the carrier supply layer.

As used herein, "different property" refers to the case where portions of the insulating film exhibit different physical properties; for example, the case where the portions are formed of different materials, the portions are formed of similar materials with different compositions, or the portions exhibit different crystallinities or crystal structures.

A sixth aspect of the present invention is drawn to a specific embodiment of the semiconductor device according to any of the second to fifth aspects, wherein the insulating film has a thickness smaller than that of the second carrier transport layer.

A seventh aspect of the present invention is drawn to a specific embodiment of the semiconductor device according to any of the second to sixth aspects, wherein each of the first electrode and the second electrode is in ohmic contact with the corresponding second carrier transport layer.

An eighth aspect of the present invention is drawn to a specific embodiment of the semiconductor device according to any of the second to seventh aspects, wherein one of the first electrode and the second electrode is electrically connected to the control electrode.

A ninth aspect of the present invention is drawn to a specific embodiment of the semiconductor device according to any of the first to eighth aspects, wherein the semiconductor device further comprises a layer for preventing transport of carriers in a region away from the second carrier transport layer (hereinafter the layer may be referred to as a "carrier transport preventing layer"), and the first carrier transport layer is provided on the carrier transport preventing layer.

A tenth aspect of the present invention is drawn to a specific embodiment of the semiconductor device according to the ninth aspect, wherein the carrier transport preventing layer is formed of a Group III nitride semiconductor having a conduction type different from that of the Group III nitride semiconductor of the first carrier transport layer.

An eleventh aspect of the present invention is drawn to a specific embodiment of the semiconductor device according to the ninth or tenth aspect, wherein the carrier transport preventing layer is formed of a Group III nitride semiconductor having a bandgap larger than that of the Group III nitride semiconductor of the first carrier transport layer.

A twelfth aspect of the present invention is drawn to a specific embodiment of the semiconductor device according to the ninth or tenth aspect, wherein the carrier transport preventing layer is provided on a layer formed of a Group III nitride semiconductor having a bandgap larger than that of the Group III nitride semiconductor of the carrier transport preventing layer.

A thirteenth aspect of the present invention is drawn to a specific embodiment of the semiconductor device according to any of the first to twelfth aspects, wherein the carrier supply layer is formed of a plurality of layers.

A fourteenth aspect of the present invention is drawn to a specific embodiment of the semiconductor device according to any of the first to thirteenth aspects, wherein the semiconductor device further comprises, on the carrier supply layer, one or more layer pairs, each pair including an under layer formed through selective growth of a Group III nitride semiconductor, and an upper layer formed through selective growth of a Group III nitride semiconductor having a bandgap larger than that of the Group III nitride semiconductor of the under layer and wherein an under layer which contacts with the carrier supply layer has a bandgap larger than that of the Group III nitride semiconductor of the carrier supply layer.

A fifteenth aspect of the present invention is drawn to a specific embodiment of the semiconductor device according to any of the first to fourteenth aspects, wherein lateral end surfaces of the second carrier transport layer and the carrier supply layer are inclined such that the area of a horizontal cross section of the second carrier transport layer and the carrier supply layer parallel to the main surface of the device is reduced with increasing distance between the cross section and the first carrier transport layer.

In a sixteenth aspect of the present invention, there is provided a power converter comprising at least one of the semiconductor devices as recited in the first to fifteenth aspects.

In a seventeenth aspect of the present invention, there is provided a method for producing a semiconductor device, comprising:

forming a first carrier transport layer from a Group III nitride semiconductor;

forming a mask on a region of the first carrier transport layer;

selectively re-growing a second carrier transport layer on an unmasked region of the first carrier transport layer from a Group III nitride semiconductor; and selectively growing a carrier supply layer on the second carrier transport layer from a Group III nitride semiconductor having a bandgap different from that of the Group III nitride semiconductor of the second carrier transport layer.

An eighteenth aspect of the present invention is drawn to a specific embodiment of the method for producing the semiconductor device according to seventeenth aspect, wherein laminate structures comprising the second carrier transport layer and the carrier supply layer are formed on two separate regions of a surface of the first carrier transport layer, the two separate regions being separated by the mask; and wherein the method further comprises;

removing the mask;

forming an insulating film which is provided on a region of the first carrier transport layer sandwiched between the two separate regions and also on the mutually facing lateral end surfaces of the two separate laminate structures; and forming a control electrode formed on the insulating film.

A nineteenth aspect of the present invention is drawn to a specific embodiment of the method for producing the semiconductor device according to eighteenth aspect, comprising:

forming the insulating film also on the top surfaces of the carrier supply layers, and forming the control electrode extends, via the insulating film, onto the carrier supply layers.

A twentieth aspect of the present invention is drawn to a specific embodiment of the method for producing the semiconductor device according to eighteenth aspect, further comprising:

forming a first electrode on the carrier supply layer of one of the two separate regions to be electrically connected to the second carrier transport layer of the same region;

forming a second electrode on the carrier supply layer of the other region to be electrically connected to the second carrier transport layer of the same region.

In the semiconductor device according to the first aspect, a 2DEG layer is formed in the vicinity of the heterojunction interface between the second carrier transport layer and the carrier supply layer and on the side of the second carrier transport layer, and the 2DEG layer serves as a channel. Since the second carrier transport layer is selectively re-grown on the first carrier transport layer, selective re-growth-associated impurities are incorporated at the heterojunction interface between the first carrier transport layer and the second carrier transport layer. However, the amount of impurities contained in a portion of the second carrier transport layer is reduced with increasing distance between the portion and the first carrier transport layer. Therefore, virtually no selective re-growth-associated impurities are observed at the heterojunction interface between the second carrier transport layer and the carrier supply layer. Since the carrier supply layer is continuously grown on the second carrier transport layer after selective re-growth of the second carrier transport layer, flatness of the heterojunction interface between the second carrier transport layer and the carrier supply layer is higher than that of the heterojunction interface between the first carrier transport layer and the carrier supply layer in the case where the carrier supply layer is selectively re-grown directly on the first carrier transport layer. Therefore, according to the semiconductor device of the present invention, there can be prevented degradation of flatness associated with selective re-growth, as well as reduction in mobility of 2DEG due to incorporated impurities associated with selective re-growth, and on-state resistance can be reduced.

As described in the second aspect, the present invention is applicable to a semiconductor device in which conduction between first and second electrodes is controlled by means of a control electrode (e.g., an HEMT), and realizes a semiconductor device exhibiting low on-state resistance.

As described in the third aspect, when the control electrode is also formed, via the insulating film, on the carrier supply layer, a larger amount of electrons can be accumulated at the interface between the insulating film and lateral end surfaces of the second carrier transport layer and the carrier supply layer, and the concentration of 2DEG generated below the control electrode can be further increased, resulting in further reduction in on-state resistance.

As described in the fourth aspect, a portion or the entirety of the insulating film may be formed of a plurality of layers.

As described in the fifth aspect, a portion of the insulating film provided on the first carrier transport layer may exhibit a property different from that of a portion of the insulating film provided on the carrier supply layer.

According to the sixth aspect, a larger amount of electrons can be accumulated at the interface between the insulating film and lateral end surfaces of the second carrier transport layer and the carrier supply layer, and on-state resistance can be further reduced.

According to the seventh aspect, the on-state resistance of the semiconductor device of the second aspect can be further reduced.

As described in the eighth aspect, the present invention is applicable to a diode having a configuration in which a short circuit is formed between the control electrode and either of the first and second electrodes of the semiconductor device of the second aspect, and realizes a diode exhibiting low on-state voltage and high breakdown voltage.

As described in the ninth to twelfth aspects, when the carrier transport preventing layer is provided, flow of electrons can be prevented in a region away from the heterojunction interface between the second carrier transport layer and the carrier supply layer, and off-state leakage current can be reduced.

As described in the thirteenth aspect, the carrier supply layer may be formed of a plurality of layers.

According to the fourteenth aspect, a plurality of 2DEG layers can be formed, which realizes a semiconductor device exhibiting lower on-state resistance.

According to the fifteenth aspect, electric field crowding is relaxed, and thus breakdown voltage can be improved.

As described in the sixteenth aspect, when the semiconductor device of the present invention is applied to a power converter, the power converter can attain low loss and high performance.

According to the seventeenth aspect, the amount of impurities incorporated upon selective re-growth of the second carrier transport layer on the first carrier transport layer is reduced as growth of the second carrier transport layer proceeds. Therefore, virtually no impurities are incorporated at the heterojunction interface between the second carrier transport layer and the carrier supply layer. In addition, formation of the second carrier transport layer improves flatness of the heterojunction interface between the second carrier transport layer and the carrier supply layer. Thus, a semiconductor device exhibiting low on-state resistance can be produced.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

Specific embodiments of the present invention will next be described with reference to the drawings. However, the present invention is not limited to the embodiments.

Embodiment 1

Figure 1:
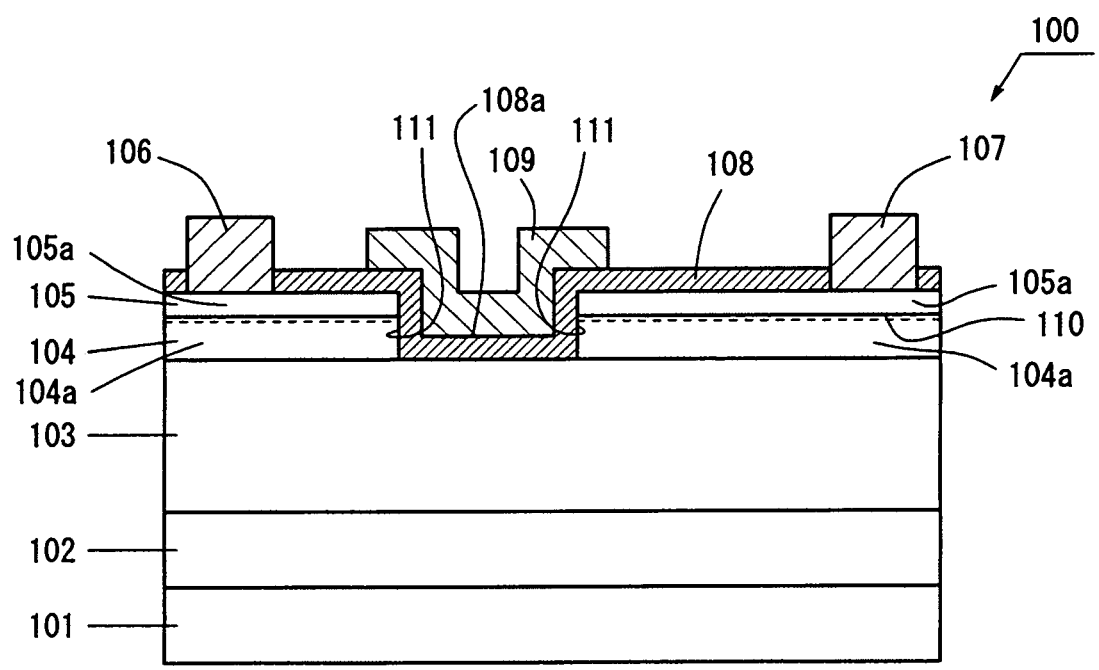
FIG. 1 shows the configuration of an HEMT 100 according to Embodiment 1.

FIG. 1 shows the configuration of an HEMT 100 according to Embodiment 1.

The HEMT 100 includes an Si substrate 101; an AlN buffer layer 102 provided on the substrate 101; and a first carrier transport layer 103 formed of undoped GaN and provided on the AlN buffer layer 102.

Two separate second carrier transport layers 104 formed of undoped GaN are provided on two separate regions of the first carrier transport layer 103. Carrier supply layers 105 formed of $Al_{0.25}Ga_{0.75}N$ are respectively provided on the two separate second carrier transport layers 104. The second carrier transport layer 104 and the carrier supply layer 105 form a heterojunction therebetween. The heterojunction forms a channel on which electrons conduct. The second carrier transport layer 104 and the carrier supply layer 105 are respectively formed through selective crystal re-growth.

A source electrode 106 is formed on one of the two separate carrier supply layers 105, and a drain electrode 107 is formed on the other carrier supply layer 105. Each of the source electrode 106 and the drain electrode 107 is formed of Ti/Al (Ti and Al are sequentially provided on the carrier supply layer).

An $SiO_2$ insulating film 108 is provided on a region of the first carrier transport layer 103 which is located between two separate laminate structures each including the second carrier transport layer 104 and the carrier supply layer 105, and on which the second carrier transport layers 104 are not provided. The insulating film 108 is also provided on two mutually facing lateral end surfaces 111 of the two laminate structures each including the second carrier transport layer 104 and the carrier supply layer 105, and is also provided on the carrier supply layers 105.

A gate electrode 109 is provided, via the insulating film 108, on a region of the first carrier transport layer 103 on which the second carrier transport layers 104 are not provided and on the two lateral end surfaces 111. The gate electrode 109 is formed of Ni/Au (Ni and Au are sequentially provided on the insulating film 108). The gate electrode 109 is also provided, via the insulating film 108, on the carrier supply layers 105 in the vicinity of the lateral end surfaces 111 such that the gate electrode 109 extends 0.5 μm from the lateral end surfaces 111 toward the source electrode 106 and the drain electrode 107, respectively. When the gate electrode 109 is provided so as to extend in this manner, in the case where positive voltage is applied to the gate electrode 109, a larger amount of electrons can be accumulated in the channel in the vicinity of the lateral end surfaces 111, and the concentration of 2DEG can be further increased in a region of the channel located below the thus-extended gate electrode 109. Therefore, on-state resistance can be further reduced.

The first carrier transport layer 103 has a thickness of 2 μm; the second carrier transport layer 104 has a thickness of 100 nm; the carrier supply layer 105 has a thickness of 25 nm; and the insulating film 108 has a thickness of 40 nm. The distance between the source electrode 106 and the gate electrode 109 is 1.5 μm, and the distance between the gate electrode 109 and the drain electrode 107 is 6.5 μm; i.e., the HEMT 100 has an asymmetric configuration in which the gate electrode 109 is provided proximal to the source electrode 106. Thus, the gate electrode 109 is located nearer to the source electrode 106 than to the drain electrode 107 for the purpose of improving breakdown voltage.

The substrate 101 may be formed of, in place of Si, any known material which has been conventionally used in a growth substrate for a Group III nitride semiconductor (e.g., sapphire, SiC, ZnO, spinel, or GaN).

The buffer layer 102 may be formed of GaN in place of AlN, or may be formed of a plurality of layers (e.g., AlN/GaN). The first carrier transport layer 103 may be formed of any Group III nitride semiconductor, but is preferably formed of GaN, from the viewpoint of, for example, crystallinity. The first carrier transport layer 103 may be doped with an n-type impurity, or may be formed of a plurality of layers. The first carrier transport layer 103 may be formed directly on the substrate 101 without formation of the buffer layer 102.

The second carrier transport layer 104 is formed of GaN, and the carrier supply layer 105 is formed of AlGaN. However, each of the second carrier transport layer 104 and the carrier supply layer 105 may be formed of any Group III nitride semiconductor, so long as the bandgap of the Group III nitride semiconductor of the carrier supply layer 105 is larger than that of the Group III nitride semiconductor of the second carrier transport layer 104. For example, the second carrier transport layer 104 may be formed of InGaN, and the carrier supply layer 105 may be formed of GaN or AlGaN. The carrier supply layer 105 may be doped with an impurity such as Si (i.e., n-type). The carrier supply layer 105 may have a cap layer thereon. The second carrier transport layer 104 and the first carrier transport layer 103 may be formed of the same Group III nitride semiconductor material or different Group III nitride semiconductor materials.

By virtue of the heterojunction formed between the second carrier transport layer 104 and the carrier supply layer 105, a 2DEG layer, i.e., a channel, (a portion shown by a dotted line in FIG. 1) is formed in the vicinity of the heterojunction interface 110 between the second carrier transport layer 104 and the carrier supply layer 105 and on the side of the second carrier transport layer 104. The second carrier transport layers 104 and the carrier supply layers 105 are formed of portions 104a and 105a and portions 104b and 105b, which are separated by the gate electrode 109. Therefore, the 2DEG layer i.e., the channel, is formed in separate two regions; i.e., a region in which the source electrode 106 is formed on the carrier supply layer 105 (source-gate region) and a region in which the drain electrode 107 is formed on the carrier supply layer 105 (gate-drain region).

Each of the source electrode 106 and the drain electrode 107 is in ohmic contact with the second carrier transport layer 104 via the carrier supply layer 105 by means of the tunnel effect. Each of the source electrode 106 and the drain electrode 107 may be formed of, for example, Ti/Au in place of Ti/Al. Each electrode may be formed of a material for providing Schottky contact, but such a material is not preferred from the viewpoint of reduction in on-state resistance. For the purpose of attaining good ohmic contact, a region of the carrier supply layer 105 or the second carrier transport layer 104 directly below the source electrode 106 or the drain electrode 107 may be doped with Si at high concentration, or the thickness of the carrier supply layer 105 directly below the source electrode 106 or the drain electrode 107 may be reduced.

The insulating film 108 serves as both a gate insulating film and a protective film. The insulating film 108 may be formed of, in place of $SiO_2$, $SiN_x$, $Al_2O_3$, $HfO_2$, $ZrO_2$, AlN, or a similar material. Although the insulating film 108 is formed of a single layer, a portion or the entirety of the insulating film 108 may be formed of a plurality of layers. For example, when the insulating film 108 includes two layers, the film may be formed of, for example, $SiO_2/ZrO_2$ (which refers to the case where $SiO_2$ and $ZrO_2$ are sequentially provided on the first carrier transport layer 103, the same shall apply hereinafter in this paragraph), $SiO_2/Al_2O_3$, $SiO_2/HfO_2$, $SiN/SiO_2$, or $Al_2O_3/ZrO_2$. When the insulating film 108 includes three layers, the film may be formed of, for example, $SiN/SiO_2/ZrO_2$ or $SiO_2/Al_2O_3/HfO_2$.

The gate electrode 109 may be formed of, for example, Ti/Al, W, or polysilicone in place of Ni/Au.

In the HEMT 100, when bias voltage is not applied to the gate electrode 109, the 2DEG layers separated in the source-gate region and the gate-drain region are not electrically connected. Therefore, current does not flow between the source electrode and the drain electrode (i.e., OFF state). Thus, the HEMT 100 exhibits a normally-off characteristic. Meanwhile, when a bias voltage equal to or higher than the threshold voltage is applied to the gate electrode 109, electrons are accumulated in a region which is in contact with the gate electrode 109 via the insulating film 108; specifically, in the vicinity of the surface of the first carrier transport layer 103 on which the second carrier transport layers 104 are not provided (i.e., a region in which the insulating film 108 is in contact with the first carrier transport layer 103), and in the vicinity of the mutually facing lateral end surfaces 111 of the second carrier transport layers 104 and the carrier supply layers 105. By means of the thus-accumulated electrons, the 2DEG layer located in the source-gate region is electrically connected to the 2DEG layer located in the gate-drain region. As a result, current flows between the source electrode and the drain electrode (i.e., ON state).

In the HEMT 100, since the second carrier transport layer 104 is selectively re-grown on the first carrier transport layer 103 by using a mask 113 (FIG. 2B), impurities are incorporated at the interface between the first carrier transport layer 103 and the second carrier transport layer 104.

That is, a substrate on which the layers from the buffer layer 102 to the first carrier transport layer 103 are grown is taken out of i.e., a MOCVD growth chamber and the mask 113 for selective re-growth is deposited on the first carrier transport layer 103 in e.g., a plasma process chamber. After the substrate with the mask 113 is returned into the MOCVD growth chamber, the second carrier transport layer 104 is selectively re-grown on the area of the first carrier transport layer 103, the area on which the mask 113 is not formed. The surface of the first carrier transport layer 103 is contaminated with impurities at the stages of the plasma process for depositing the mask 113 and transport processes of the substrate between the MOCVD growth chamber and the plasma process chamber. Hereinafter the impurities contaminating the surface of the first carrier transport layer 103 in the processes before the re-growth are called as re-growth-associated impurities.

However, even if the surface of the first carrier transport layer 103 is contaminated with impurities in the process before the re-growth, the amount of re-growth-associated impurities contained in the second carrier transport layer 104 is reduced in accordance with increasing distance from the interface between the first carrier transport layer 103 and the second carrier transport layer 104. Therefore, virtually no re-growth-associated impurities are observed at the heterojunction interface 110 between the second carrier transport layer 104 and the carrier supply layer 105. Since the carrier supply layer 105 is continuously grown on the second carrier transport layer 104 after re-growth of the second carrier transport layer 104, flatness of the heterojunction interface 110 between the second carrier transport layer 104 and the carrier supply layer 105 is higher than that of the heterojunction interface between the first carrier transport layer 103 and the carrier supply layer 105 in the case where the carrier supply layer 105 is grown directly on the first carrier transport layer 103. Therefore, there is not reduced the mobility of 2DEG generated in the vicinity of the heterojunction interface 110 between the second carrier transport layer 104 and the carrier supply layer 105 and on the side of the second carrier transport layer 104. Thus, the HEMT 100 according to Embodiment 1 exhibits a normally-off characteristic and low on-state resistance.

From the viewpoints of sufficient reduction in amount of re-growth-associated impurities at the heterojunction interface between the second carrier transport layer 104 and the carrier supply layer 105, as well as improvement of flatness of the interface, the thickness of the second carrier transport layer 104 is preferably 50 nm or more.

In the HEMT 100, the thickness of the insulating film 108 is adjusted to be smaller than that of the second carrier transport layer 104 so that the level of the top surface 108a of the insulating film 108 formed on the first carrier transport layer 103 is below that of the heterojunction interface 110 between the second carrier transport layer 104 and the carrier supply layer 105; i.e., the top surface 108a is nearer to the first carrier transport layer 103 than the heterojunction interface 110 is. With this structure, when positive voltage is applied to the gate electrode 109, a larger amount of electrons can be accumulated in the vicinity of the two lateral end surfaces 111. As a result, on-state resistance can be further reduced.

Next will be described a method for producing the HEMT 100 with reference to FIG. 2.

Figure 2A:
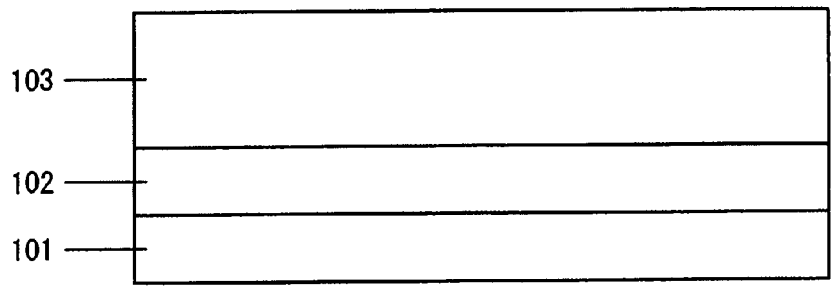
FIGS. 2A to 2D are sketches showing processes for producing the HEMT 100 according to Embodiment 1.

Firstly, an AlN buffer layer 102 is formed on an Si substrate 101 through MOCVD in a MOCVD growth chamber. Then, a first carrier transport layer 103 is formed from undoped GaN on the buffer layer 102 through MOCVD (FIG. 2A). Hydrogen and nitrogen are employed as carrier gases; ammonia is employed as a nitrogen source; TMG (trimethylgallium) is employed as a Ga source; and TMA (trimethylaluminum) is employed as an Al source.

Figure 2B:
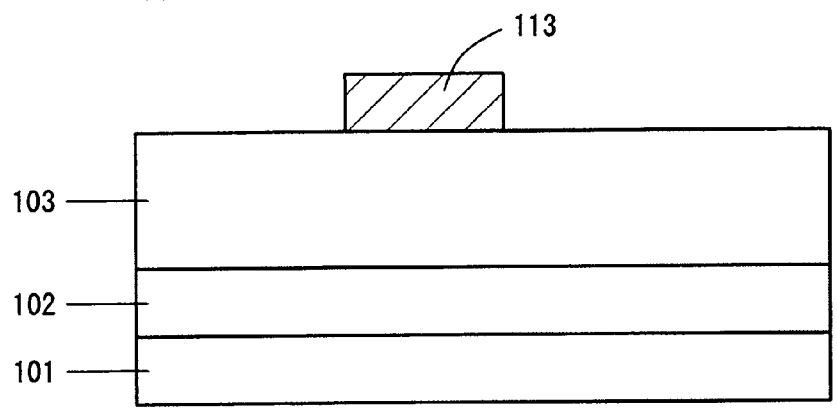

Subsequently, after the Si substrate 101 having layers 102 and 103 is taken out of the MOCVD growth chamber, an SiO$_2$ mask 113 is formed on a specific region of the first carrier transport layer 103 through CVD in a plasma CVD chamber, and the mask 113 is not formed on two regions separated by the mask 113, to thereby expose the surface of the first carrier transport layer 103 (FIG. 2B). No particular limitation is imposed on the material of the mask 113, so long as the material inhibits growth of a Group III nitride semiconductor. The mask 113 may be formed of, in place of SiO$_2$ film, an insulating film of, for example, Si$_3$N$_4$, Al$_2$O$_3$, HfO$_2$, or ZrO$_2$.

Figure 2C:
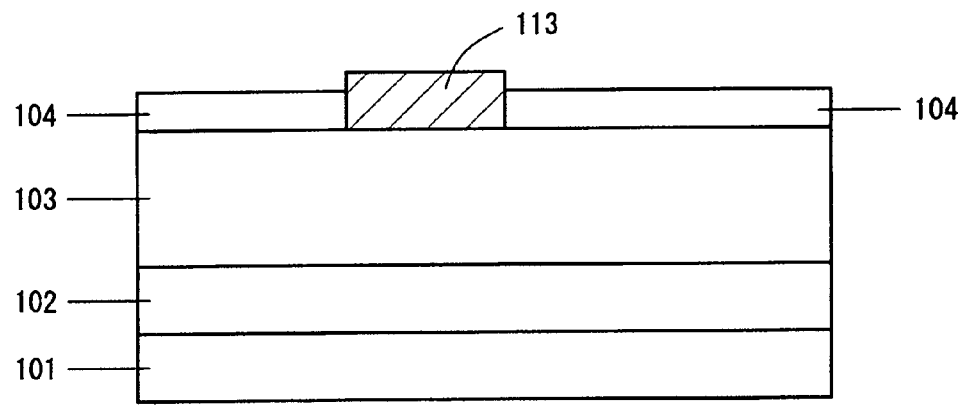

Subsequently, the Si substrate 101 having layers 102, 103 and the mask 113 is returned into the MOCVD growth chamber. The surface of the first carrier transport layer 103 is contaminated with impurities at the stages of mask formation process and transport processes of the substrate between the MOCVD growth chamber and the plasma process chamber. A second carrier transport layer 104 made of undoped GaN is re-grown on the first carrier transport layer 103 through MOCVD in the MOCVD growth chamber. Since GaN is not grown on the mask 113 because of inhibition of crystal growth, the second carrier transport layer 104 is selectively re-grown only on the two regions separated by the mask 113 (FIG. 2C). Since the growth of the first carrier transport layer 103 and the second carrier transport layer 104 is not continuous but the second carrier transport layer 104 is re-grown after forming the mask 113 in the chamber other than the MOCVD growth chamber as described above, flatness of the interface between the first carrier transport layer 103 and the second carrier transport layer 104 is degraded, and impurities are incorporated at the interface. However, as growth of the second carrier transport layer 104 proceeds, flatness of the growing surface of the layer 104 is improved, and density of growth-associated impurities on the growing surface is decreased.

Figure 2D:
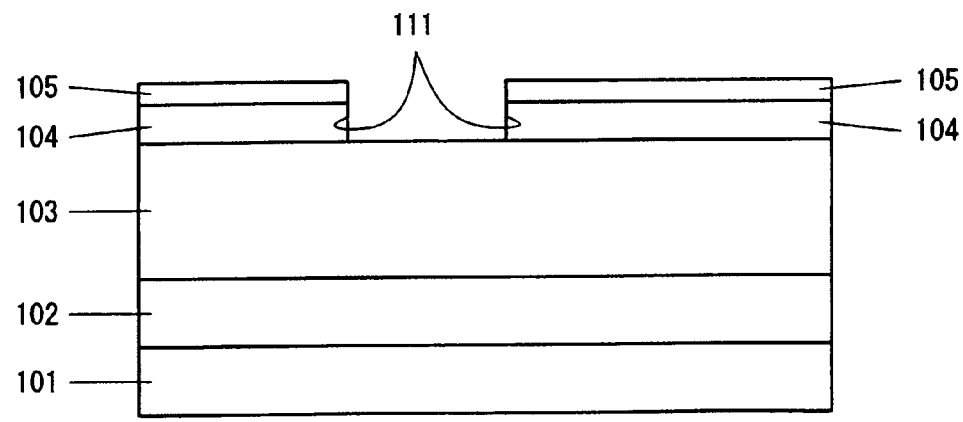

After the second carrier transport layer 104 has been grown so as to have a specific thickness, an Al$_{0.25}$Ga$_{0.75}$N carrier supply layer 105 is successively grown thereon through MOCVD. During this growth process, crystal growth on the mask 113 is also inhibited. Therefore, the carrier supply layer 105 is grown only on the two second carrier transport layers 104. When the growth of the carrier supply layer 105 is started, flatness of the surface of the second carrier transport layer 104, on which the carrier supply layer 105 is grown, has been already improved, and density of impurities on the surface has been decreased substantially to zero. Therefore, flatness of the heterojunction interface between the second carrier transport layer 104 and the carrier supply layer 105 is high, and virtually no growth-associated impurities are observed in the vicinity of the interface. After the carrier supply layer 105 has been grown so as to have a specific thickness, the mask 113 is removed (FIG. 2D).

Subsequently, an SiO$_2$ insulating film 108 is formed on a region of the first carrier transport layer 103 on which the second carrier transport layers 104 are not provided; on two mutually facing lateral end surfaces 111 of two separate laminate structures each including the second carrier transport layer 104 and the carrier supply layer 105; and on the carrier supply layers 105. The insulating film 108 serves as both a gate insulating film and a protective film of the carrier supply layer 105 for common use to reduce the number of production processes thereby. The insulating film 108 is formed through, for example, CVD, sputtering, or ALD. Subsequently, the insulating film 108 is removed so as to expose regions of the carrier supply layer 105 on which a source electrode 106 and a drain electrode 107 are formed, and the source electrode 106 and the drain electrode 107 are formed on the thus-exposed regions of the carrier supply layer 105 through vapor deposition and the lift-off process. A gate electrode 109 is formed on a portion of the insulating film 108, through vapor deposition and the lift-off process, the portion including an area above a region of the first carrier transport layer 103 on which the second carrier transport layer 104 is not provided; two front areas of the two lateral end surfaces 111; and an area above the carrier supply layer 105 in the vicinity of the lateral end surfaces 111. Thus, the HEMT 100 shown in FIG. 1 is produced.

In the HEMT 100 produced through this production method, flatness of the heterojunction interface between the second carrier transport layer 104 and the carrier supply layer 105 is improved, and virtually no growth-associated impurities are observed in the vicinity of the interface. Therefore, the HEMT 100 exhibits a normally-off characteristic, and low on-state resistance.

In the aforementioned production method for the HEMT 100, the mask 113 employed for crystal growth is removed after formation of the carrier supply layer 105. However, the mask 113 may be left and employed as a gate insulating film.

Embodiment 2

Figure 3:
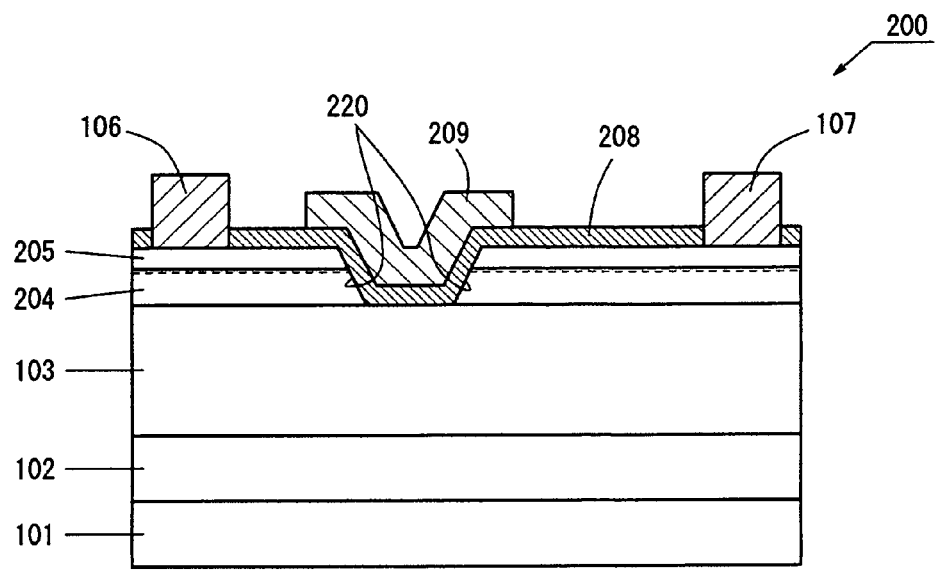
FIG. 3 shows the configuration of an HEMT 200 according to Embodiment 2.

FIG. 3 shows the configuration of an HEMT 200 according to Embodiment 2. The HEMT 200 has the same configuration as the HEMT 100 according to Embodiment 1, except that the second carrier transport layer 104, the carrier supply layer 105, the insulating film 108, and the gate electrode 109 are respectively replaced with a second carrier transport layer 204, a carrier supply layer 205, an insulating film 208, and a gate electrode 209. The second carrier transport layer 204 and the carrier supply layer 205 differ from the second carrier transport layer 104 and the carrier supply layer 105 only in that two mutually facing lateral end surfaces 220 of two separate laminate structures each including the second carrier transport layer 204 and the carrier supply layer 205 are inclined. Similar to the case of the second carrier transport layer 104 and the carrier supply layer 105, the second carrier transport layer 204 and the carrier supply layer 205 are formed through selective re-growth and selective growth, respectively. The lateral end surfaces 220 are inclined such that the area of a horizontal cross section of the second carrier transport layer 204 and the carrier supply layer 205 parallel to the main surface of the device (i.e., parallel to the main surface of the substrate 101) is reduced with increasing distance between the cross section and the first carrier transport layer 103. The insulating film 208 and the gate electrode 209 are the same as the insulating film 108 and the gate electrode 109, respectively, except that the insulating film 208 and the gate electrode 209 are formed on the inclined lateral end surfaces 220.

The inclined lateral end surfaces 220 can be formed by growing the second carrier transport layer 204 and the carrier supply layer 205 under specific growth conditions. Under such specific growth conditions, the second carrier transport layer 204 and the carrier supply layer 205 can be grown in a direction perpendicular to the main surface of the device (i.e., c-plane of Group III nitride semiconductor) with keeping facet surfaces (e.g., (10-11) plane) inclined with respect to c-plane at a side wall. The thus-inclined facet surfaces serve as the lateral end surfaces 220.

Thus, when the lateral end surfaces 220 of the second carrier transport layer 204 and the carrier supply layer 205 are inclined, electric field crowding is relaxed in the vicinity of the surface of the first carrier transport layer 103 which is in contact with the gate electrode 209 via the insulating film 208, and in the vicinity of the lateral end surfaces 220. Therefore, the HEMT 200 exhibits breakdown voltage higher than that of the HEMT 100.

Embodiment 3

Figure 4:
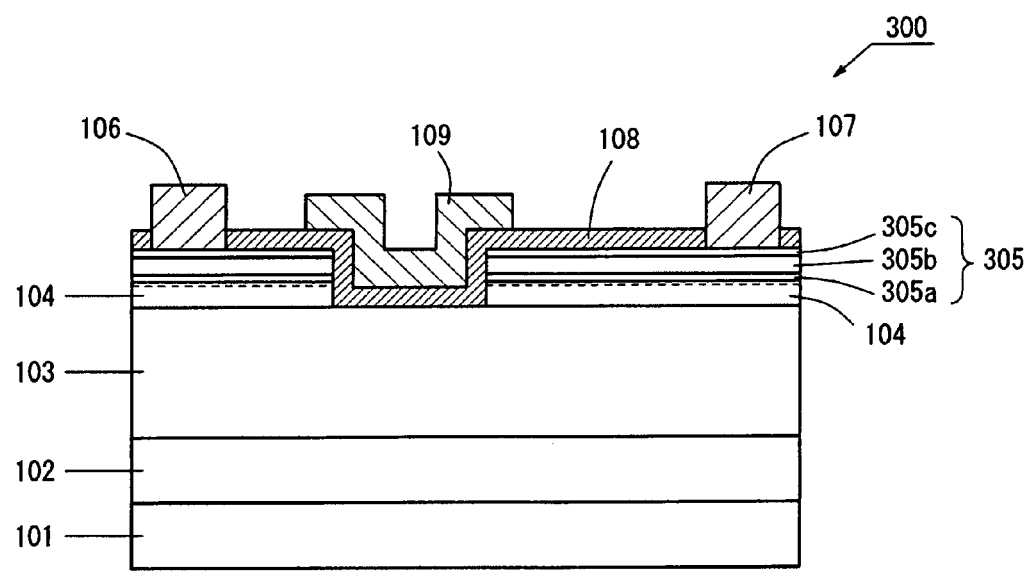
FIG. 4 shows the configuration of an HEMT 300 according to Embodiment 3.

FIG. 4 shows the configuration of an HEMT 300 according to Embodiment 3. The HEMT 300 has the same configuration as the HEMT 100 according to Embodiment 1, except that the carrier supply layer 105 is replaced with a carrier supply layer 305 as described below. The carrier supply layer 305 has a three-layer structure including a first carrier supply layer 305a formed of undoped GaN, a second carrier supply layer 305b formed of undoped AlGaN, and a third carrier supply layer 305c formed of undoped AlN, which layers are sequentially stacked on the second carrier transport layer 104. The second carrier transport layer 104 is selectively re-grown on the first carrier transport layer 103 and the carrier supply layer 305 is selectively grown on the second carrier transport layer 104 similar to the case of the second carrier transport layer 104 and the carrier supply layer 105 in Embodiment 1, respectively.

In the HEMT 300, the second carrier transport layer 104 and the carrier supply layer 305 having a three-layer structure are formed on the first carrier transport layer 103 through selective re-growth and selective growth, respectively in a manner similar to that described above. Therefore, in the HEMT 300, reduction in mobility of 2DEG is suppressed, and on-state resistance is reduced.

The carrier supply layer 305 may have another multi-layer structure. For example, the carrier supply layer 305 may have a laminate structure including two layers, three layers, or four or more layers, such as GaN/AlGaN (which refers to a laminate structure in which GaN and AlGaN are sequentially provided on the first carrier transport layer 103, the same shall apply hereinafter in this paragraph), InGaN/AlGaN, InGaN/AlGaN/AlN or InGaN/GaN/AlGaN/AlN. Alternatively, the carrier supply layer 305 may have a structure including a plurality of layers doped with n-type impurities at different concentrations, such as n$^-$-AlGaN/n-AlGaN.

Embodiment 4

Figure 5:
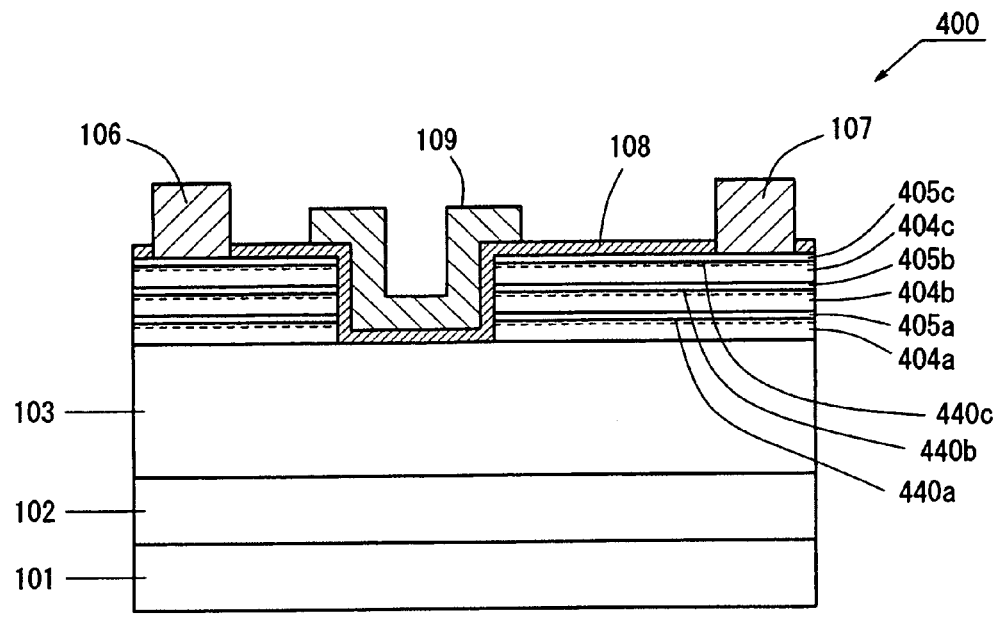
FIG. 5 shows the configuration of an HEMT 400 according to Embodiment 4.

FIG. 5 shows the configuration of an HEMT 400 according to Embodiment 4. The HEMT 400 has the same configuration as the HEMT 100 according to Embodiment 1, except that the second carrier transport layer 104 and the carrier supply layer 105 are replaced with three layer pairs each including a second carrier transport layer 404 and a carrier supply layer 405; specifically, a second carrier transport layer 404a, a carrier supply layer 405a, a second carrier transport layer 404b, a carrier supply layer 405b, a second carrier transport layer 404c, and a carrier supply layer 405c are sequentially stacked on the first carrier transport layer 103. Similar to the case of the second carrier transport layer 104 and the carrier supply layer 105 of the HEMT 100, the three layer pairs of the second carrier transport layer 404 and the carrier supply layer 405 are formed on the first carrier transport layer 103 through selective re-growth and selective growth.

2DEG layers are formed respectively at the heterojunction interface 440a between the second carrier transport layer 404a and the carrier supply layer 405a and on the side of the second carrier transport layer 404a; at the heterojunction interface 440b between the second carrier transport layer 404b and the carrier supply layer 405b and on the side of the second carrier transport layer 404b; and at the heterojunction interface 440c between the second carrier transport layer 404c and the carrier supply layer 405c and on the side of the second carrier transport layer 404c. Since the second carrier transport layer 404a is formed on the first carrier transport layer 103 through selective re-growth and the other second carrier transport layers 404b, 404c and the carrier supply layers 405a, 405b and 405c are formed on the second carrier transport layers 404a, 404b and 404c, respectively through selective growth, the heterojunction interfaces 440a, 440b, and 440c exhibit high flatness, and virtually no growth-associated impurities are incorporated at regions in the vicinity of the heterojunction interfaces 440a, 440b, and 440c. Therefore, reduction in mobility of 2DEG generated in the vicinity of the heterojunction interfaces 440a, 440b, and 440c is suppressed, and on-state resistance is reduced.

As described above, the HEMT 400 according to Embodiment 4 has a structure including three 2DEG layers, in which reduction in mobility of 2DEG is suppressed. Therefore, the HEMT 400 exhibits further reduced on-state resistance.

In Embodiment 4, the second carrier transport layers 404a, 404b, and 404c have the same composition, and the carrier supply layers 405a, 405b, and 405c have the same composition. However, the second carrier transport layers 404a, 404b, and 404c may have different compositions, and the carrier supply layers 405a, 405b, and 405c may have different compositions, so long as heterojunction interfaces are formed between the second carrier transport layer 404a and the carrier supply layer 405a, between the second carrier transport layer 404b and the carrier supply layer 405b, and between the second carrier transport layer 404c and the carrier supply layer 405c, and a 2DEG layer is formed in the vicinity of each of the heterojunction interfaces.

Embodiment 5

Figure 6:
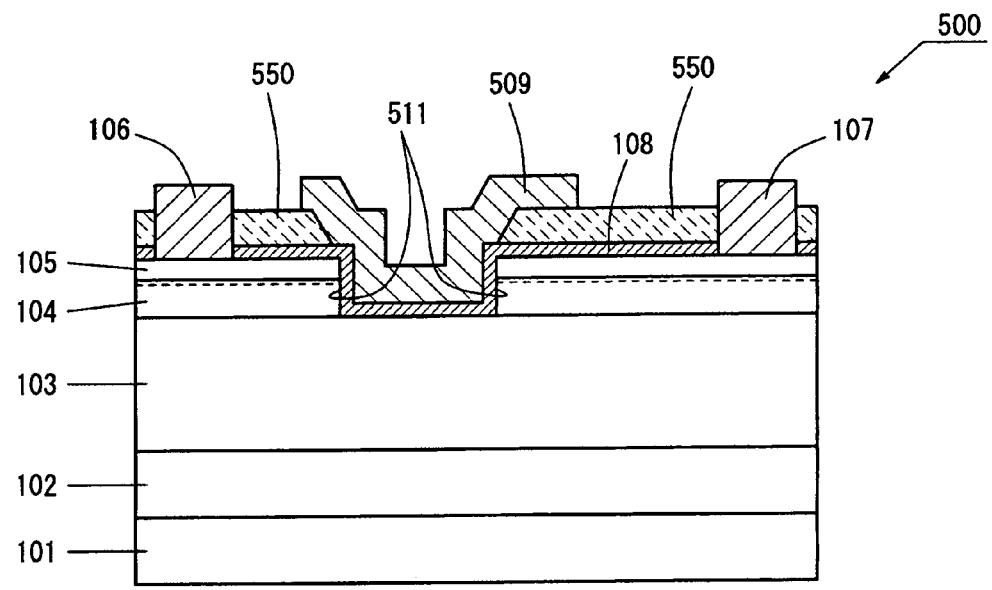
FIG. 6 shows the configuration of an HEMT 500 according to Embodiment 5.

FIG. 6 shows the configuration of an HEMT 500 according to Embodiment 5. The HEMT 500 has the same configuration as the HEMT 100 according to Embodiment 1, except for the below-described modification. In the HEMT 500, a $ZrO_2$ insulating film 550 having a specific dielectric constant higher than that of the $SiO_2$ insulating film 108 is formed on a region of the insulating film 108 on which neither the source electrode 106 nor the drain electrode 107 is formed, which region is located above the carrier supply layer 105. A gate electrode 509 is formed, via the insulating film 108, on a region of the first carrier transport layer 103 on which the second carrier transport layers 104 are not provided, and on two mutually facing lateral end surfaces 511 of the two separate laminate structures each including the second carrier transport layer 104 and the carrier supply layer 105. Also, the gate electrode 509 extends 0.5 μm from the lateral end surface 511 (on the side of the source electrode 106) toward the source electrode 106 such that the gate electrode 509 is provided on the insulating film 550, and the gate electrode 509 extends 1.5 μm from the lateral end surface 511 (on the side of the drain electrode 107) toward the drain electrode 107 such that the gate electrode 509 is provided on the insulating film 550.

In the structure of the HEMT 500, the insulating film 550, which has a specific dielectric constant higher than that of the insulating film 108, is provided between the insulating film 108 and the gate electrode 509 extending from the lateral end surface 511 (on the side of the drain electrode 107) of the second carrier transport layer 104 and the carrier supply layer 105 toward the drain electrode 107. Therefore, upon OFF operation, electric field intensity is reduced in the insulating film 108 on the carrier supply layer 105 in the vicinity of the lateral end surface 511 on the side of the drain electrode 107. Thus, the HEMT 500 exhibits further improved breakdown voltage.

Embodiment 6

Figure 7:
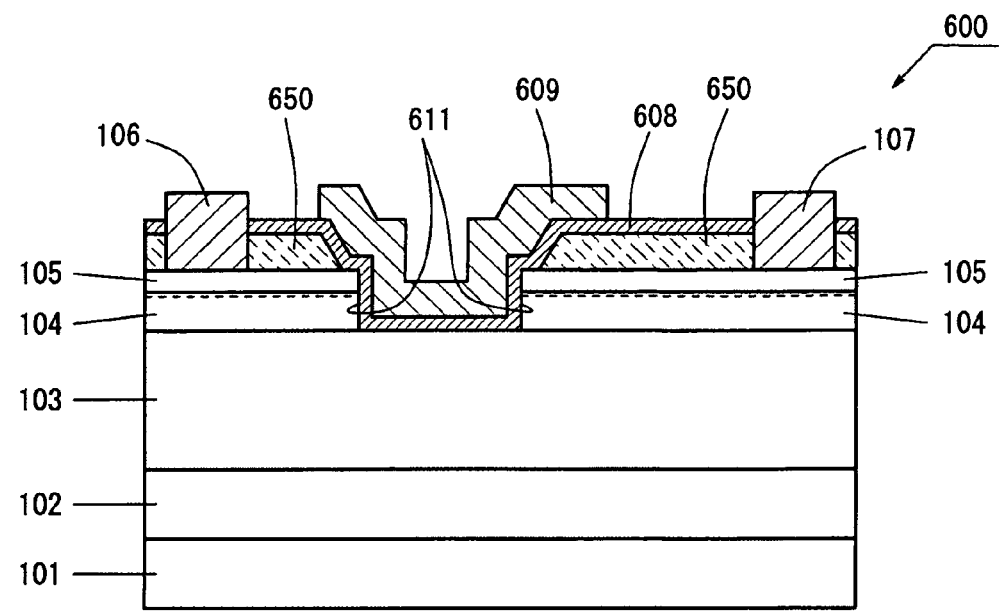
FIG. 7 shows the configuration of an HEMT 600 according to Embodiment 6.

FIG. 7 shows the configuration of an HEMT 600 according to Embodiment 6. The HEMT 600 has the same configuration as the HEMT 100 according to Embodiment 1, except for the below-described modification. In the HEMT 600, an SiN insulating film 650 is formed on a region of the carrier supply layer 105 on which neither the source electrode 106 nor the drain electrode 107 is formed. An $SiO_2$ insulating film 608 is formed continuously on the first carrier transport layer 103, on two mutually facing lateral end surfaces 611 of the two separate laminate structures each including the second carrier transport layer 104 and the carrier supply layer 105, and on the insulating film 650. A gate electrode 609 is formed, via the insulating film 608, on the first carrier transport layer 103 and on the lateral end surfaces 611. Also, the gate electrode 609 is formed on the insulating film 608 so as to extend 0.5 μm from the lateral end surface 611 (on the side of the source electrode 106) toward the source electrode 106, and the gate electrode 609 is formed on the insulating film 608 so as to extend 1.5 μm from the lateral end surface 611 (on the side of the drain electrode 107) toward the drain electrode 107.

In the HEMT 600, the $SiO_2$ insulating film 608 exhibiting high breakdown voltage is provided on the lateral end surfaces 611 and on a region of the first carrier transport layer 103 in which the second carrier transport layers 104 are not formed, in which electric field intensity increases upon ON operation. Also, the $SiO_2$ insulating film 608 exhibiting high breakdown voltage is provided directly below the end (on the side of the drain electrode) of the gate electrode 609 at which electric field intensity increases upon OFF operation. The insulating film 650 is provided on a region of the carrier supply layer 105 which is directly below the end (on the side of the drain electrode) of the gate electrode 609 at which electric field intensity increases upon OFF operation. Since the insulating film 650 is formed of SiN, interface state density can be reduced at the interface between the carrier supply layer 105 and the insulating film 650, and characteristic deterioration (e.g., current collapse (i.e., considerable reduction in drain current upon high-voltage operation)) can be suppressed, as compared with the case where the insulating film 650 is formed of $SiO_2$.

Thus, the HEMT 600 has a structure in which the insulating film provided on a region requiring high breakdown voltage is formed of a material different from that of the insulating film provided on a region requiring reduction in interface state density. Therefore, the HEMT 600 realizes improvement of breakdown voltage, as well as prevention of characteristic deterioration due to high interface state density.

Embodiment 7

Figure 8:
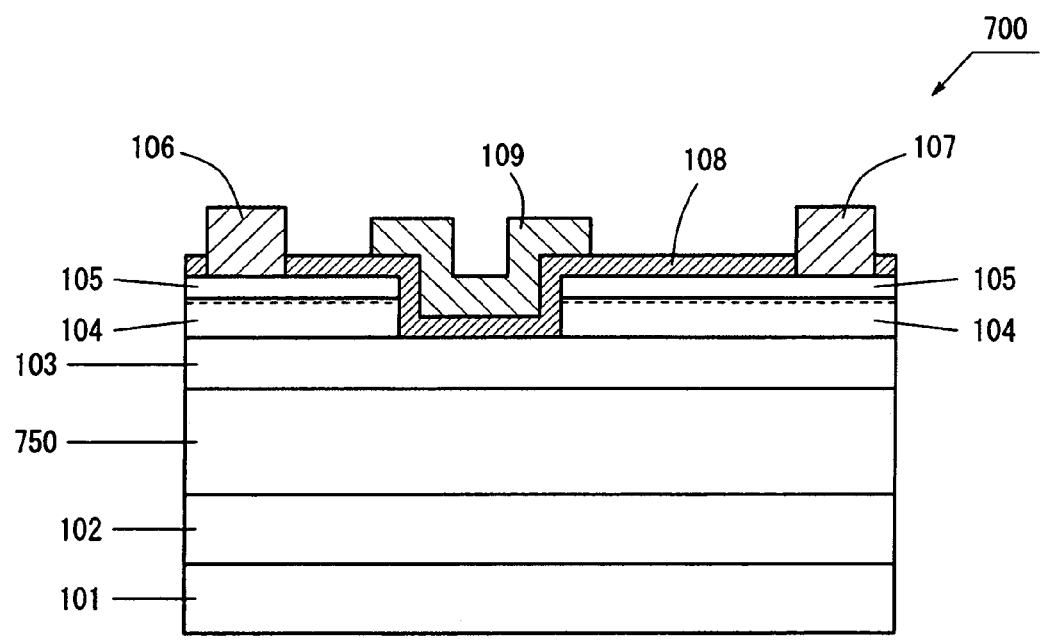
FIG. 8 shows the configuration of an HEMT 700 according to Embodiment 7.

FIG. 8 shows the configuration of an HEMT 700 according to Embodiment 7. The HEMT 700 has the same configuration as the HEMT 100 according to Embodiment 1, except that a carrier transport preventing layer 750 is provided between the buffer layer 102 and the first carrier transport layer 103. The carrier transport preventing layer 750 is formed of a p-GaN layer doped with Mg ($1 \times 10^{19}$ cm$^{-3}$) and having a thickness of 100 nm and hole concentration of $1 \times 10^{17}$ cm$^{-3}$.

The carrier transport preventing layer 750 exhibits high resistance to electron flow. Therefore, when high bias voltage is applied between the source electrode and the drain electrode upon OFF operation, the carrier transport preventing layer 750 can block a current path via a region away from the heterojunction interface between the second carrier transport layer 104 and the carrier supply layer 105. Thus, in the HEMT 700, leakage current between the source electrode and the drain electrode is reduced upon OFF operation. Similar to the case of the HEMT 100, the HEMT 700 exhibits a normally-off characteristic and reduced on-state resistance.

When the carrier transport preventing layer 750 is provided, the distance between the carrier transport preventing layer 750 and the carrier supply layer 105 must be adjusted to a specific distance or more. Specifically, the total thickness of the first carrier transport layer 103, the second carrier transport layer 104, and the carrier supply layer 105 is preferably adjusted to 100 nm or more. This is because, when the distance between the carrier transport preventing layer 750 and the carrier supply layer 105 is small, upon formation of the first carrier transport layer 103, the second carrier transport layer 104, and the carrier supply layer 105, Mg incorporated into the carrier transport preventing layer 750 may be diffused into the carrier supply layer 105, resulting in reduction in concentration or mobility of 2DEG. Also, the carrier transport preventing layer 750, which is of a p-type, may effect reduction in 2DEG concentration.

In Embodiment 7, the carrier transport preventing layer 750 is formed of p-GaN. However, no particular limitation is imposed on the material of the carrier transport preventing layer 750, so long as the material can prevent transport of electrons in a region away from the second carrier transport layer 104. For example, the carrier transport preventing layer 750 may have a conduction type different from that of the first carrier transport layer 103. Since the first carrier transport layer 103 is formed of undoped GaN (i.e., low-concentration n-type layer), the carrier transport preventing layer 750 may be formed of p-GaN or i-GaN.

The carrier transport preventing layer 750 may be formed of AlGaN, which has a bandgap larger than that of undoped GaN (i.e., the material of the first carrier transport layer 103). When the carrier transport preventing layer 750 is formed of AlGaN, negative polarized charges are generated at the heterojunction interface between the first carrier transport layer 103 and the carrier transport preventing layer 750, and these charges and discontinuity of bands at the heterojunction interface act as barriers for electrons. Thus, when high bias voltage is applied between the source electrode and the drain electrode upon OFF operation, the carrier transport preventing layer 750 can block a current path via a region away from the heterojunction interface between the second carrier transport layer 104 and the carrier supply layer 105, and can reduce leakage current between the source electrode and the drain electrode. When the thickness of the carrier transport preventing layer 750 is excessively small, electrons penetrate the carrier transport preventing layer 750 by means of the tunnel effect, and leakage current flows through the buffer layer 102. Therefore, the carrier transport preventing layer 750 preferably has a thickness of 100 nm or more.

The carrier transport preventing layer 750 may be formed of InGaN, which has a bandgap smaller than that of the material of the buffer layer 102. When the carrier transport preventing layer 750 is formed of InGaN, negative polarized charges are generated at the heterojunction interface between the buffer layer 102 and the carrier transport preventing layer 750, and these charges and discontinuity of bands at the heterojunction interface act as barriers for electrons. Thus, when high bias voltage is applied between the source electrode and the drain electrode upon OFF operation, the carrier transport preventing layer 750 can block a current path via a region away from the heterojunction interface between the second carrier transport layer 104 and the carrier supply layer 105, and can reduce leakage current between the source electrode and the drain electrode. Since the material of the carrier transport preventing layer 750 has a bandgap smaller than that of undoped GaN (i.e., the material of the first carrier transport layer 103), leakage current flows through the carrier transport preventing layer 750. Therefore, preferably, the amount of leakage current which flows through the carrier transport preventing layer 750 is reduced by adjusting the thickness of the carrier transport preventing layer 750 to 200 nm or less. More preferably, the carrier transport preventing layer 750 is formed of p-InGaN or i-InGaN.

Embodiment 8

Figure 9:
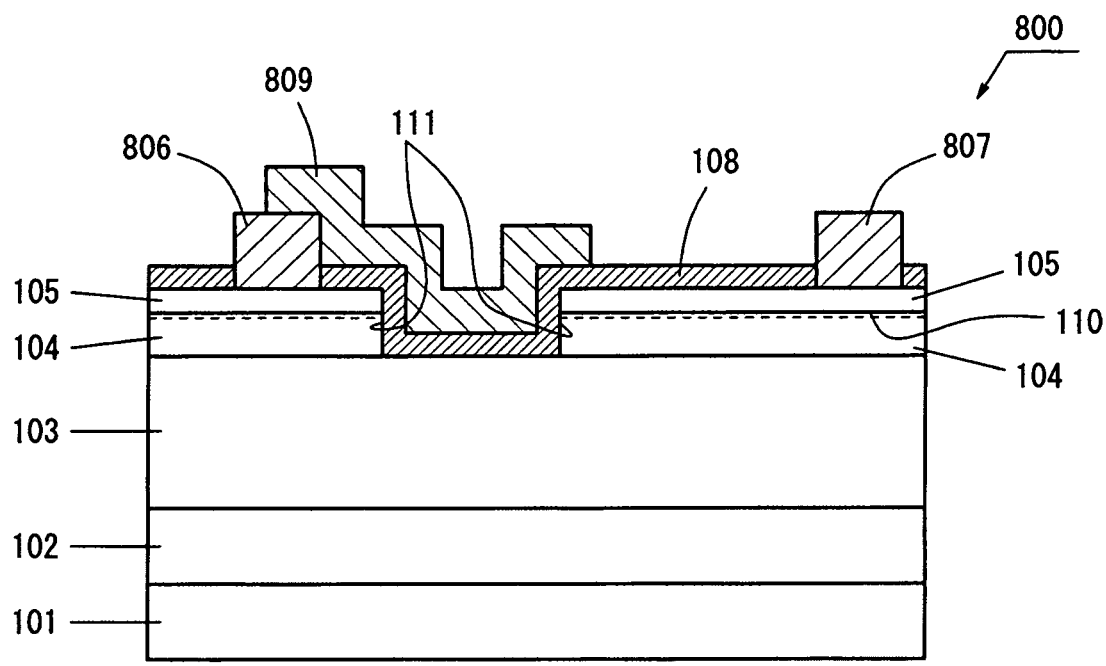
FIG. 9 shows the configuration of a diode 800 according to Embodiment 8.

FIG. 9 shows the configuration of a diode 800 according to Embodiment 8. In the diode 800, the source electrode 106 and the drain electrode 107 of the HEMT 100 according to Embodiment 1 are replaced with an anode 806 and a cathode 807, respectively, and the gate electrode 109 of the HEMT 100 is replaced with a gate electrode 809. The gate electrode 809 is formed by extending the gate electrode 109 of the HEMT 100 toward the anode 806 so as to cover the anode 806. The anode 806 and the cathode 807 have the same configuration as the source electrode 106 and the drain electrode 107 of the HEMT 100 according to Embodiment 1; i.e., the anode 806 and the cathode 807 are formed of Ti/Al. The gate electrode 809 is formed of Ni/Au.

Each of the anode 806 and the cathode 807 is in ohmic contact with the second carrier transport layer 104 via the carrier supply layer 105 by means of the tunnel effect. Under application of bias voltage, the gate electrode 809 acts as a control electrode for controlling the amount of electrons in the vicinity of the surface of the first carrier transport layer 103 which is in contact with the gate electrode 809 via the insulating film 108, and in the vicinity of the two mutually facing lateral end surfaces 111 of the two separate laminate structures each including the second carrier transport layer 104 and the carrier supply layer 105.

Similar to the case of the HEMT 100 according to Embodiment 1, in the diode 800, a 2DEG layer is formed in the vicinity of the heterojunction interface 110 between the second carrier transport layer 104 and the carrier supply layer 105 and on the side of the second carrier transport layer 104. The second carrier transport layers 104 and the carrier supply layers 105 are provided in two regions separated by the gate electrode 809. Therefore, the 2DEG layer is formed in separate two regions; i.e., a region between the anode and the gate electrode, and a region between the gate electrode and the cathode.

Operation of the diode 800 will now be described. When forward bias voltage is applied between the anode 806 and the cathode 807 of the diode 800, electrons are accumulated in the vicinity of the surface of the first carrier transport layer 103 which is in contact, via the insulating film 108, with the gate electrode 809 electrically connected to the anode 806, and in the vicinity of the lateral end surfaces 111. By means of the thus-accumulated electrons, the 2DEG layer provided between the anode and the gate electrode is electrically connected to the 2DEG layer provided between the gate electrode and the cathode, and current flows between the anode 806 and the cathode 807. In contrast, when reverse bias voltage is applied between the anode 806 and the cathode 807, electrons are depleted in the vicinity of the gate electrode 809 electrically connected to the anode 806, and 2DEG between the gate electrode and the cathode is also depleted, resulting in interruption of current flow.

Thus, in the diode 800 according to Embodiment 8, the amount of electrons are controlled by the gate electrode 809 via the insulating film, whereby rectification is achieved.

Similar to the case of the HEMT 100 according to Embodiment 1 described above, in the diode 800 according to Embodiment 8, flatness of the heterojunction interface 110 between the second carrier transport layer 104 and the carrier supply layer 105 is high, and virtually no growth-associated impurities are incorporated in the vicinity of the heterojunction interface 110, whereby the mobility of 2DEG is increased. Since the anode 806 is in ohmic contact with the second carrier transport layer 104, the rise voltage upon application of forward bias voltage is nearly equal to zero. Thus, the diode 800 exhibits low on-state resistance and on-state voltage.

In the diode 800, the gate electrode 809 is electrically connected to the anode 806. Therefore, when reverse bias voltage is applied to the diode 800, the electric field intensity becomes highest at the end (on the side of the cathode 807) of the gate electrode 809. The insulating film 108 is formed at the cathode-side end of the gate electrode 809, and the gate electrode 809 is in contact, via the insulating film 108, with the second carrier transport layer 104 and the carrier supply layer 105. Therefore, reverse leakage current can be considerably reduced at the end of the gate electrode 809 with high electric field intensity. Thus, the diode 800 exhibits high breakdown voltage upon OFF operation.

The diode 800 according to Embodiment 8 has a structure in which the source electrode 106 of the HEMT 100 according to Embodiment 1 is employed as the anode 806, and the gate electrode 109 is connected to the anode 806 by extending the gate electrode 109 toward the anode 806. The diode 800 may have another structure, so long as the source electrode 106 of the HEMT 100 according Embodiment 1 is employed as the anode 806, and the anode 806 is electrically connected to the gate electrode 109. For example, the diode 800 may have a structure in which the anode is electrically connected to the gate electrode 109 by extending the anode toward the gate electrode 109. Alternatively, the diode 800 may have a structure in which the anode and the gate electrode 109 are indirectly connected by means of, for example, a wire electrode. Alternatively, the diode 800 may have a composite anode structure in which the anode and the gate electrode 109 are formed from the same (common) material.

The diode 800 according to Embodiment 8 has a structure in which the source electrode 106 of the HEMT 100 according to Embodiment 1 is employed as the anode, and the anode is electrically connected to the gate electrode. A diode exhibiting effects similar to those of the diode 800 can be realized by providing a structure in which the drain electrode of each of the HEMTs 200 to 700 according to Embodiments 2 to 7 is employed as the anode, and the anode is electrically connected to the gate electrode.

Embodiment 9

Figure 10:
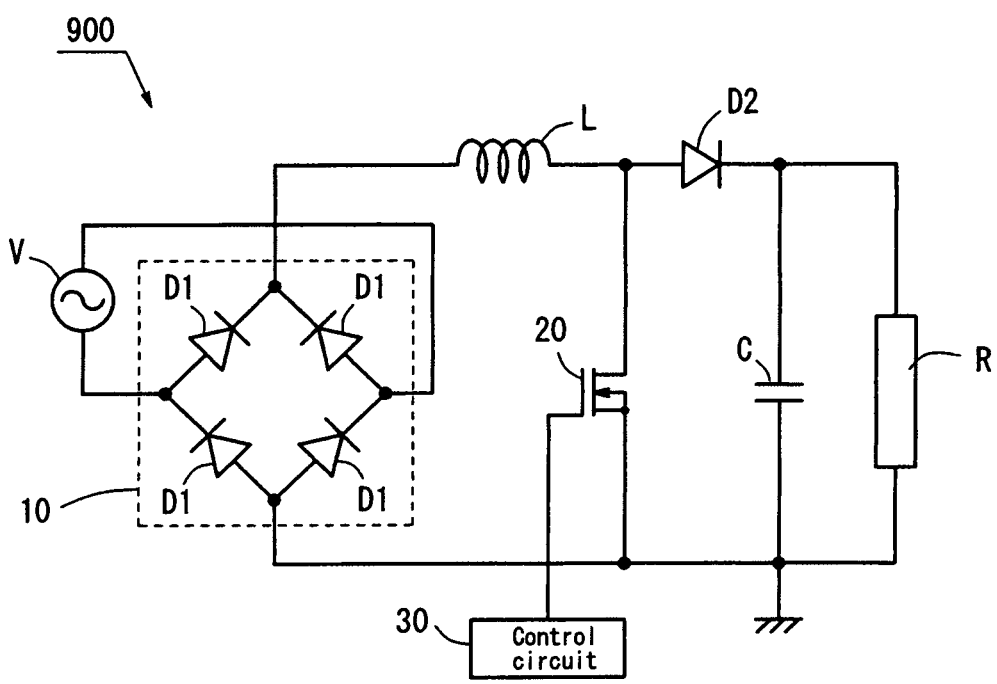
FIG. 10 shows the configuration of a power factor improving circuit 900 according to Embodiment 9.

FIG. 10 shows the configuration of a power factor improving circuit 900 according to Embodiment 9. The power factor improving circuit 900 includes an AC power supply V, and a diode bridge 10 having four diodes D1 for rectifying AC voltage from the AC power supply V. Also, the power factor improving circuit 900 includes an HEMT 20 whose drain electrode is connected to the positive (higher voltage) output terminal (on the DC side) of the diode bridge 10 via an inductor L, and whose source electrode is connected to the negative (lower voltage) output terminal (on the DC side) of the diode bridge 10; and a control circuit 30 which is connected to the gate electrode of the HEMT 20. A circuit connecting a diode D2 and a capacitor C in series is connected between the source electrode and the drain electrode of the HEMT 20, and the capacitor C is connected to a resistor R in parallel. The power factor improving circuit 900 improves the power factor of the AC power supply V by controlling ON/OFF of the HEMT 20 by means of the control circuit 30 on the basis of, for example, output voltage or current which flows through the diode bridge 10.

The power factor improving circuit 900 having the aforementioned configuration employs, as the diode D1 or D2, the diode 800 according to Embodiment 8, and, as the HEMT 20, the HEMT 100 according to Embodiment 1. Therefore, the power factor improving circuit 900 exhibits reduced loss, and realizes highly effective operation with low loss.

In the aforementioned Embodiments, the semiconductor device of the present invention is applied to an HEMT or a diode. However, the present invention is also applicable to another semiconductor device in which a 2DEG layer formed at the interface between a carrier transport layer and a carrier supply layer serves as a channel; for example, a heterojunction bipolar transistor (HBT).

The HEMTs according to Embodiments 1 to 7 may incorporate a field plate structure for further improving breakdown voltage.

The semiconductor device of the present invention exhibits low on-state resistance. Therefore, when the semiconductor device of the present invention is applied to a power converter, the power converter realizes high performance.

What is claimed is:

1. A semiconductor device comprising:
   a first carrier transport layer formed of a Group III nitride semiconductor;
   a second carrier transport layer which is formed through selective re-growth of a Group III nitride semiconductor and is provided on a region of the first carrier transport layer; and
   a carrier supply layer formed through selective growth of a Group III nitride semiconductor having a bandgap larger than that of the Group III nitride semiconductor of the second carrier transport layer, the carrier supply layer being provided on the second carrier transport layer,
   wherein laminate structures comprising the second carrier transport layer and the carrier supply layer are formed on two separate regions of a surface of the first carrier transport layer, and
   wherein the semiconductor device further comprises:
   a first electrode which is provided on the carrier supply layer of one of the two separate regions and which is electrically connected to the second carrier transport layer of the same region;
   a second electrode which is provided on the carrier supply layer of the other region and which is electrically connected to the second carrier transport layer of the same region;
   an insulating film which is provided on a region of the first carrier transport layer sandwiched between the two separate regions and also on the mutually facing lateral end surfaces of the two separate laminate structures; and
   a control electrode formed on the insulating film.

2. A semiconductor device according to claim 1, wherein the insulating film has a thickness smaller than that of the second carrier transport layer.

3. A semiconductor device according to claim 1, wherein each of the first electrode and the second electrode is in ohmic contact with the corresponding second carrier transport layer.

4. A semiconductor device according to claim 1, wherein one of the first electrode and the second electrode is electrically connected to the control electrode.

5. A semiconductor device according to claim 1, wherein the carrier supply layer comprises a plurality of layers.

6. A semiconductor device according to claim 1, the semiconductor device further comprising:
   on the carrier supply layer, one or more layer pairs,
   each pair comprising an under layer formed through selective growth of a Group III nitride semiconductor, and an upper layer formed through selective growth of a Group III nitride semiconductor having a bandgap larger than that of the Group III nitride semiconductor of the under layer,
   wherein an under layer which contacts with the carrier supply layer has a bandgap smaller than that of the Group III nitride semiconductor of the carrier supply layer.

7. A semiconductor device according to claim 1, wherein lateral end surfaces of the second carrier transport layer and the carrier supply layer are inclined such that the area of a horizontal cross section of the second carrier transport layer and the carrier supply layer parallel to the main surface of the device is reduced with increasing distance between the cross section and the first carrier transport layer.

8. A power converter comprising the semiconductor device according to claim 1.

9. A semiconductor device according claim 1, wherein the insulating film is provided also on the top surfaces of the carrier supply layers, and the control electrode extends, via the insulating film, onto the carrier supply layers.

10. A semiconductor device according to claim 9, wherein a portion or the entirety of the insulating film comprises a plurality of layers.

11. A semiconductor device according to claim 9, wherein a portion of the insulating film provided on the first carrier transport layer exhibits a property different from that of a portion of the insulating film provided on the carrier supply layer.

12. A semiconductor device according to claim 1, wherein the semiconductor device further comprises a layer for preventing transport of carriers in a region away from the second carrier transport layer, and the first carrier transport layer is provided on the carrier transport preventing layer.

13. A semiconductor device according to claim 12, wherein the carrier transport preventing layer is formed of a Group III nitride semiconductor having a conduction type different from that of the Group III nitride semiconductor of the first carrier transport layer.

14. A semiconductor device according claim 12, wherein the carrier transport preventing layer comprises a Group III nitride semiconductor having a bandgap larger than that of the Group III nitride semiconductor of the first carrier transport layer.

15. A semiconductor device according to the claim 12, wherein the carrier transport preventing layer is provided on a layer formed of a Group III nitride semiconductor having a bandgap larger than that of the Group III nitride semiconductor of the carrier transport preventing layer.

* * * * *